(12) United States Patent
Khare et al.

(10) Patent No.: US 10,014,041 B1
(45) Date of Patent: Jul. 3, 2018

(54) INTEGRATED CIRCUITS, METHODS AND INTERFACE CIRCUITRY TO SYNCHRONIZE DATA TRANSFER BETWEEN HIGH AND LOW SPEED CLOCK DOMAINS

(71) Applicant: Texas Instruments Incorporated, Dallas, TX (US)

(72) Inventors: Nikunj Khare, Bangalore (IN); Rajeev Suvarna, Bangalore (IN); Gregory A. North, Austin, TX (US); Maneesh Soni, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/389,814

(22) Filed: Dec. 23, 2016

(51) Int. Cl.
  *G11C 7/22* (2006.01)
  *G11C 7/10* (2006.01)
(52) U.S. Cl.
  CPC ........... *G11C 7/222* (2013.01); *G11C 7/1012* (2013.01)
(58) Field of Classification Search
  CPC .................. G11C 7/222; G11C 7/1012
  See application file for complete search history.

(56) References Cited

U.S. PATENT DOCUMENTS

2003/0123588 A1* 7/2003 Parikh ................ G06F 5/06
  375/354

OTHER PUBLICATIONS

Jain et al., "Synchronizer Techniques for Multi-Clock Domain SoCs & FPGAs", EDN Network, Sep. 30, 2014, 8 pgs.
Cummings, Clifford E., "Clock Domain Crossing (CDC Design & Verification Techniques Using System Verilog", Sunburst Design World Class Verilog & System Verilog Training, SNUG Boston 2008, Rev 1.0, pp. 1-56.

* cited by examiner

*Primary Examiner* — James G Norman
(74) *Attorney, Agent, or Firm* — Gregory J. Albin; Charles A. Brill; Frank D. Cimino (57) ABSTRACT

Disclosed examples include interface circuits to transfer data between a first register in a fast clock domain and a second register in a slow clock domain, including a resettable synchronizer to provide a synchronized start signal synchronized to a slow clock signal to initiate a write from the first register to the second register according to a write request signal, a pulse generator circuit to provide a write enable pulse signal according to the synchronized start signal, a write control circuit to selectively connect an output of the first register to an input of the second register to write data from the first register to the second register according to the write enable pulse signal, and a dual flip-flop to provide a reset signal synchronized to a fast clock signal according to the write request signal to clear any prior pending write request and begin a new write operation.

20 Claims, 7 Drawing Sheets

INTEGRATED CIRCUITS, METHODS AND INTERFACE CIRCUITRY TO SYNCHRONIZE DATA TRANSFER BETWEEN HIGH AND LOW SPEED CLOCK DOMAINS

BACKGROUND

Many circuits and systems include circuitry operating in different clock domains. For example, processor circuits often operate at high clock speeds, whereas peripheral circuits run at much lower clock speeds. It is often desirable for circuits of different clock domains to exchange data. For instance, a high clock speed central processor unit (CPU) may write to a data or control register used by a low clock speed peripheral device to control operation of the peripheral. Such a CPU may also read data stored in a register of the low clock speed circuit. However, transferring data between circuits of different clock domains presents problems, particularly where the high and low clock speeds are very different. In one example, peripheral circuits operating at very slow frequencies (e.g., 10-100 KHz) may need to be serviced by a CPU operating at high clock frequencies of 1-100 MHz or even higher. Application software executed by the CPU may need to update or write a value in a peripheral circuit register frequently, such as software running on a high speed processor operating a low clock speed pulse width modulation (PWM) control circuit to control an output signal or actuator. In this example, the processor may implement a closed loop control algorithm by frequently changing a pulse width value controlled by the peripheral. Frequent updates by data writes to the low speed circuit register can cause the CPU to have to wait for a potentially large number of high speed clock cycles to allow a previous data write operation to be synchronized to the low speed clock domain before again updating the peripheral. In some cases more than a thousand CPU cycles elapse just to ensure correct data synchronization. Handshaking schemes using a request-acknowledge peripheral write synchronization protocol may lead to significant data latency for back-to-back updates from fast to slow clock domains, which can inhibit the ability to perform high bandwidth closed loop control using a programmed processor and a low speed peripheral.

Problems may also arise in reading data from a low clock speed peripheral. Reading from a peripheral register poses the possibility of metastability in the data read from a low clock speed domain register. The CPU can perform multiple reads, e.g., three reads, with the CPU comparing the read results and selecting the data if consistently read twice. Another approach is for the CPU to read the peripheral register only after a status bit indicates the peripheral data is synchronized and stable. These approaches, however, require added CPU software and introduce data latency. Moreover, these techniques can lead to increased system power consumption.

SUMMARY

Disclosed examples include interface circuits to transfer data between a first register in a high speed or fast clock domain and a second register in a low speed or slow clock domain. The interface circuit includes a resettable synchronizer to provide a synchronized start signal synchronized to a slow clock signal to initiate a write from the first register to the second register according to a write request signal. A pulse generator circuit provides a write enable pulse signal according to the synchronized start signal, and a write control circuit selectively connects an output of the first register to an input of the second register to write data from the first register to the second register according to the write enable pulse signal, and a dual flip-flop circuit to provide a reset signal synchronized to a fast clock signal according to the write request signal to clear any prior pending write request and begin a new write operation. Further disclosed examples provide interface circuitry to synchronize data reads from a slow clock domain register to a fast clock domain register, including a pulse generator to provide a read enable pulse signal synchronized to the fast clock signal, and a trigger circuit to cause the pulse generator to provide a new read enable pulse signal every integer number L cycles of the second clock signal. Other disclosed examples provide integrated circuits, including a first circuit with a first register and a host processor operated according to a first clock signal, a second circuit with a peripheral circuit and a second register operated according to a slower second clock signal, and an interface circuit to synchronize data transfers between the first and second registers.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Disclosed examples include integrated circuits and interface circuitry to facilitate synchronizing data transfers between different first and second clock speed domains. For write operations to a slower peripheral register, disclosed examples use a write request signal from a host to initiate a write operation synchronized to the slower second clock signal without requiring an acknowledgment. The write request begins a write operation and interface circuitry cancels any prior pending write operations to reset the synchronization circuitry. This allows a CPU or other host circuit to simply initiate a write operation without waiting for an acknowledgment while ensuring that the most recent write data reaches the second clock domain register. Certain examples, moreover, provide synchronization within two low speed clock domain cycles. Disclosed examples facilitate use in closed loop control and other low latency applications without significant data latency and without unnecessary host processor software overhead and complexity.

Figure 1:
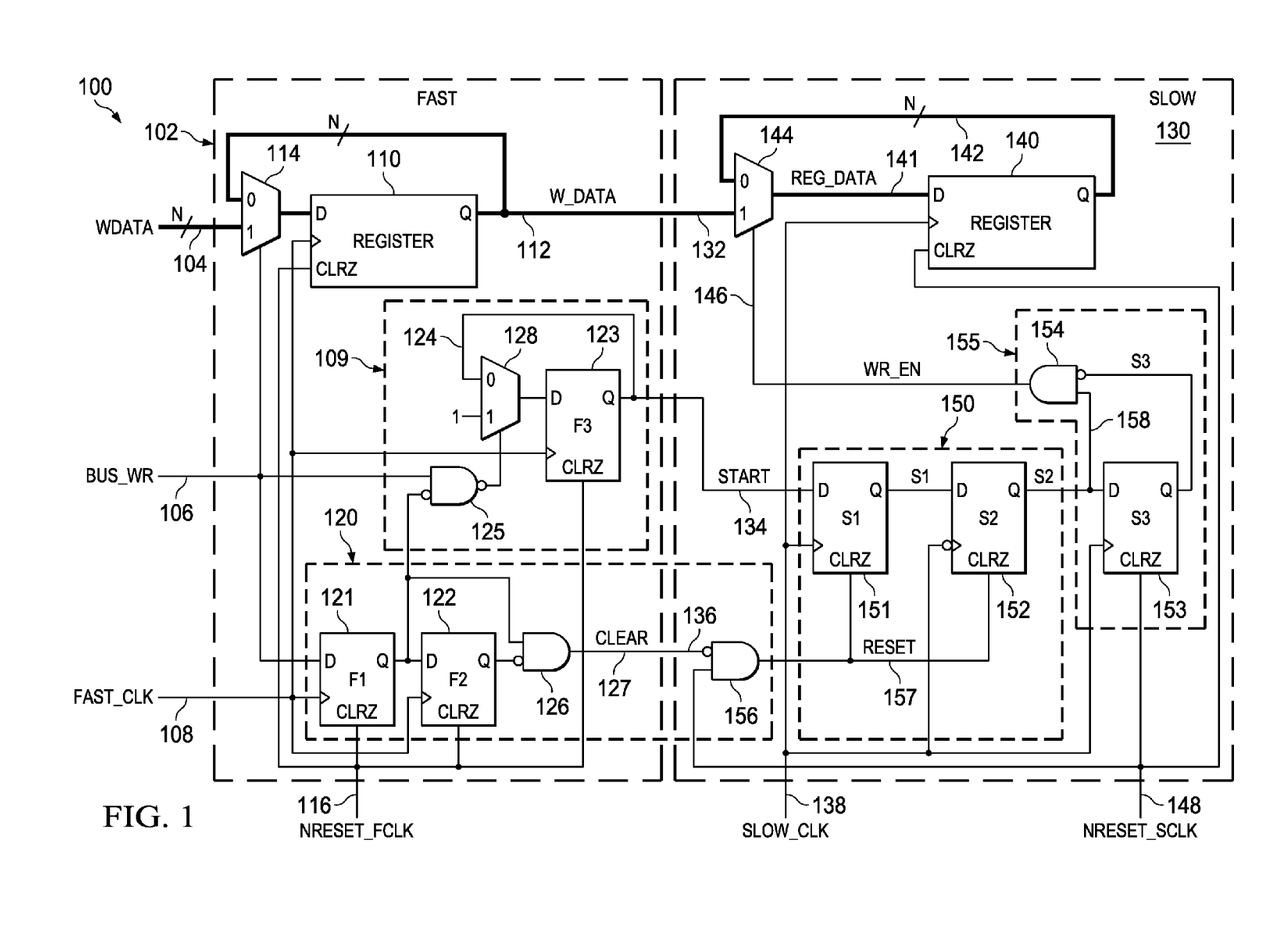
FIG. 1 is a schematic diagram of an interface circuit to synchronize data for writing from a high speed clock domain register to a lower speed clock domain register according to an embodiment.

FIG. 1 shows a system having first and second circuits 102 (FAST) and 130 (SLOW) operated according to different clock signals. The circuits 102 and 130 can be formed in separate integrated circuits (ICs), or can be circuits on a single IC. The circuits 102 and 130 are part of two separate clock domains through operation according to corresponding clock signals, which can operate independently of one another with respect to clock phasing and/or clock frequency, although not a strict requirement of all embodiments. The fast domain first circuit 102 operates according to a first clock signal FAST_CLK on a circuit node 108, and the second circuit 130 operates according to a second clock signal SLOW_CLK on a node 138. The second clock signal SLOW_CLK is slower than the first clock signal FAST_CLK.

The first circuit 102 includes an N-bit bus 104 to receive an N-bit write data signal WDATA from a host circuit (not shown in FIG. 1), where N is a positive integer greater than or equal to 1. The first circuit 102 also includes an N-bit first register 110. The first register 110 includes a clock input connected to a circuit node 108 to receive the FAST_CLK signal, and an N-bit data output 112 (designated as the "Q" output of the register 110 in the figure). The register 110 provides an N-bit data signal W_DATA to the second circuit 130 for write operations to write data from the first register 110 to a second register 140 of the second circuit 130. The first circuit 102 includes an N-bit multiplexer 114 with a control input connected to the node 106 to receive a single-bit bus write request signal BUS_WR from the host. When the signal BUS_WR is in a first state (low or "0"), the multiplexer 114 connects the N-bit output 112 to the N-bit data input ("D") of the register 110. In this state, the current data in the register 110 is refreshed for each cycle of the first clock signal FAST_CLK. When the host circuit wishes to initiate a write operation to transfer the data WDATA from the first register 110 to the second register 140, the host circuit changes the signal BUS_WR to a second state (high or "1"). In this condition, the multiplexer 114 transfers the write data W_DATA to the register 110. In addition, the transition of the bus write request signal BUS_WR to the second state initiates a write operation synchronized through interface circuitry 100 as described further below.

The interface circuit 100 synchronizes data transfer between the first register 110 and the second register 140. The interface circuit 100 in FIG. 1 facilitates write operations to transfer data from the first register 110 in the first clock domain to the second register 140 in the second clock domain. The interface circuit 100 can be considered as a separate circuit or as part of both of the first and second circuits 102, 130. Portions of the interface circuitry 100 are operated according to (e.g., clocked by) the first clock signal FAST_CLK, and other portions of the interface circuit 100 are operated according to the second clock signal SLOW_CLK.

The interface circuit 100 includes a startup circuit 109 with an output 124 that provides a start signal START to the second circuit 130. In operation, the startup circuit 109 initially provides the START signal in a first state (e.g., low or "0") after power up and reset of the host circuit, and thereafter the startup circuit 109 provides the START output signal in a different second state (high or "1") in response to a first bus write request signal BUS_WR. The startup circuit 109 prevents inadvertent enabling of a write enable signal WR_EN of the second circuit 130 after power up reset. The start circuit 109 includes a flip-flop 123 (designated "F3") with a clock input connected to the fast clock node 108, a data input (D), and a data output (Q) connected to the startup circuit output 124 to provide the START signal. The circuit 109 also includes an AND gate 125 with a first input connected to the bus write request node 106 to receive the signal BUS_WR, and a second inverting input that receives a signal from a fast clock dual flip-flop circuit 120. The dual flip-flop circuit operates to break the timing critical path originating form a host processor to the clear input CLRZ pin of synchronizer flip-flops 151 and 152 in a slow clock domain circuit 150. The output of the AND gate 125 provides a control signal to a multiplexer 128. The multiplexer 128 includes an output connected to the data input of the flip-flop 123, as well as a first input selected by a low (e.g., "0") control signal from the AND gate 125 to connect the data output of the flip-flop 123 to the data input of the flip-flop 123. In this state, the flip-flop 123 provides the START output signal as a constant value that is refreshed every cycle of the first clock signal FAST_CLK. On system power up, the AND gate 125 initially provides a low control signal to the multiplexer 128. This low control signal causes the multiplexer 128 to maintain the START signal in a first state (low). In response to the host circuit raising the bus write request node 106 (high), the AND gate 125 provides a high control signal to the multiplexer 128, causing the flip-flop 123 to receive a high data input signal. The flip-flop 123 provides a corresponding high output signal at its data output 124. Thereafter, the START signal at the startup circuit output remains high ("1") during normal operation. This provides an input value for the slow clock domain synchronizer circuit 150 as described further below.

The fast clock domain dual flip-flop circuit 120 is operated according to the first clock signal FAST_CLK. The dual flip-flop circuit 120 includes an input connected to the node 106 to receive the write request signal BUS_WR, and an output 157 to provide a reset signal RESET to the input of another synchronizer circuit 150 in the slow clock domain. The dual flip-flop circuit 120 includes a first flip-flop 121, a second flip-flop 122, and first and second AND gates 126 and 156, respectively. The output of the AND gate 156 provides the reset signal RESET to the synchronizer circuit 150 of the slow clock domain. In operation, the dual flip-flop circuit 120 provides the reset signal RESET as a pulse signal transitioning from a first state (high) to a second state (low) in response to the input 106 receiving the write request signal BUS_WR in a predetermined state (high). The RESET pulse remains low for a non-zero time synchronized to the first clock signal FAST_CLK before returning high. The reset pulse signal RESET resets the slow clock domain synchronizer circuit 150 and clears any prior pending write request. The RESET pulse signal also begins a new write from the first register 110 to the second register 140, regardless of whether a prior pending write operation was underway when the BUS_WR was asserted (high) previously. In this manner, the dual flip-flop circuit 120 allows the host circuit to initiate a write operation without handshaking, and the host circuit can initiate back-to-back write operations without waiting for any acknowledgment from the slow clock domain circuit 130.

The first flip-flop 121 includes a clock input connected to the node 108 to receive the first clock signal FAST_CLK, as well as a data input D coupled to receive the write request signal BUS_WR, and a data output Q. The second flip-flop 122 includes a clock input also connected to the node 108, a data input D connected to the data output Q of the first flip-flop 121, and a data output Q. The first AND gate 126 includes a first input connected to the data output Q of the first flip-flop 121, and a second inverting input connected to the data output Q of the second flip-flop 122. The output 127 of the AND gate 126 provides a clear signal CLEAR to a first inverting input 136 of the AND gate 156. The AND gate 156 includes a second input connected to a slow clock domain circuit node 148 to receive an active low clear or reset signal NRESET_SCLK to allow the peripheral circuit (not shown) to reset the slow clock domain synchronizer circuit 150. When the signal NRESET_CLK is high during normal operation, the AND gate 156 inverts the CLEAR signal to provide the RESET signal at the output 157.

The slow clock domain second circuit 130 includes the N-bit second register 140 with a clock input connected to the node 138 to operate according to the second clock signal SLOW_CLK. The second circuit 130 also includes a multiplexer 144 with a control input 146 connected to receive the write enable signal WR_EN from a pulse generator circuit 155, and an N-bit output providing an N-bit register data input signal REG_DATA to an N-bit data input 141 of the register 140. The input 157 of the synchronizer circuit 150 is connected to receive the reset signal RESET from the high-speed clock domain synchronizer 120. The low-speed clock domain synchronizer 150 includes an output 158 that provides a synchronized start signal S2 as an input to the pulse generator circuit 155.

In operation, the synchronizer circuit 150 provides the signal S2 in a first state (low) in response to the input 157 receiving the reset signal RESET in a first state (low). The synchronizer circuit 150 provides the signal S2 in a different second state in (high) an integer number K edges of the second clock signal SLOW_CLK after the reset signal RESET transitions to a second state (high), where K is a non-zero positive integer. In one example, K=3. In this example, the synchronizer circuit 150 ensures that data written by the host circuit from the fast clock domain register 110 to the slow clock domain register 140 is transferred within two clock cycles of the second clock signal SLOW_CLK. The first flip-flop 151 includes a clock input connected to receive the second clock signal SLOW_CLK and a data input (D) coupled to receive the signal START. In normal operation, the START signal is high after the first actuation of the bus write request signal BUS_WR following power up reset. The first flip-flop 151 and the second flip-flop 152 each include a clear input CLRZ connected to the output 157 of the high-speed clock domain synchronizer circuit 120 to receive the reset signal RESET. The second flip-flop 152 includes an inverting clock input connected to the node 138 to receive the second clock signal SLOW_CLK, as well as a data input (D) connected to the data output (Q) of the first flip-flop 151, and a data output (Q) that provides the synchronized start signal S2.

The input 158 of the pulse generator circuit 155 receives the synchronized start signal S2. An output of the pulse generator circuit 155 is connected to the input 146 of the multiplexer 144. The pulse generator circuit 155 provides the write enable pulse signal WR_EN to the multiplexer 144 in response to the synchronized start signal S2 transitioning from the first state (low) to the second state (high). The multiplexer 144 implements a write control circuit 144 that selectively connects the output 112 of the first register 110 to the N-bit input 141 of the register 140 in order to write data from the first register 110 to the second register 140 in response to the write enable pulse signal WR_EN. The pulse generator circuit 155 includes a third flip-flop 153 with a clock input connected to the node 138 to receive the second clock signal SLOW_CLK, a data input (D) connected to the data output (Q) of the second flip-flop 152, and a data output (Q). The pulse generator circuit 155 also includes an AND gate 154 with a first inverting input connected to the data output Q of the third flip-flop 153 and a second input connected to the data output (Q) of the second flip-flop 152. The output of the AND gate 154 is connected to the input 146 of the multiplexer 144 to provide the write enable pulse signal WR_EN. In the illustrated example, the clocked flip-flop 153 and the input connections to the AND gate 154 provide the write enable pulse signal WR_EN with a high state pulse width of one half cycle of the low-speed clock signal SLOW_CLK.

Figure 2:
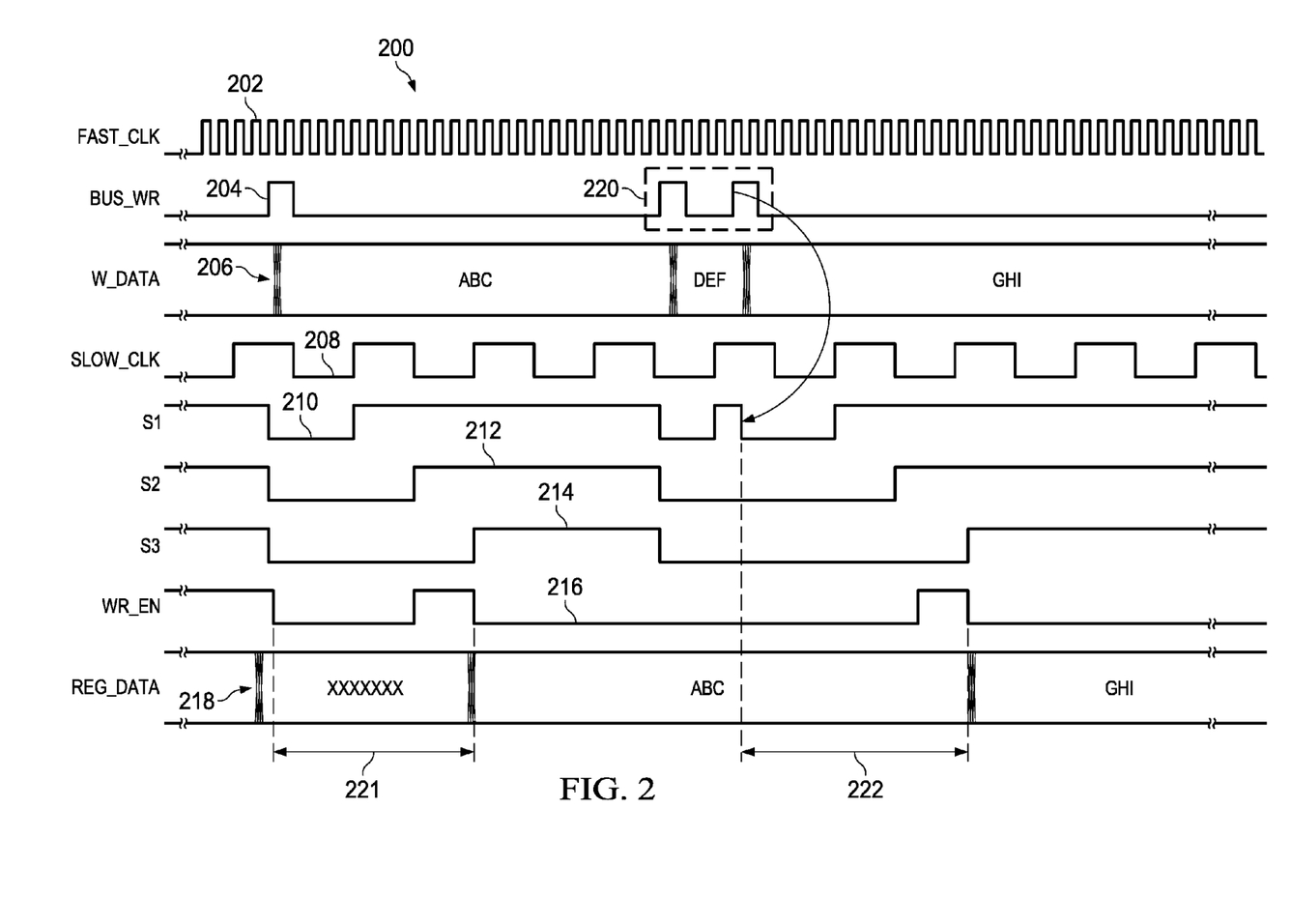
FIG. 2 is a signal diagram showing signal waveforms in the circuit of FIG. 1.

FIG. 2 shows a signal diagram 200 illustrating signal waveforms during operation of the interface circuitry 100 in FIG. 1. A curve 202 shows the first clock signal FAST_CLK, and a curve 208 shows the second clock signal SLOW_CLK. A curve 204 illustrates an example bus write request signal BUS_WR during operation of the circuitry 100, and curve 206 represents the N-bit data input signal WDATA provided to the multiplexer input 104 in the first circuit 102. The curve 210 in FIG. 2 shows the output signal S1 from the first flip-flop 151 of the slow clock domain synchronizer circuit 150. Curves 212 and 214 show the outputs S2 and S3 from the flip-flops 152 and 153, respectively. Curve 216 shows the write enable signal WR_EN from the pulse generator circuit 155, and the curve 218 represents the data REG_DATA provided to the data input of the slow clock speed register 140. In addition, the curves 206 and 218 include character representations of specific data.

In the example of FIG. 2, the host circuit initiates three example bus write requests shown as pulses in the BUS_WR curve 204. In response to the rising edge of the bus write request pulse, the N-bit output data W_DATA from the first register 100 transitions to the data WDATA provided by the host circuit. In the portion of time shown in FIG. 2, the host circuit has previously initiated a write operation with respect to data designated as "XXXXXXX" on the curve 218, and this write operation is completed in the illustrated timeframe of FIG. 2. The host circuit then initiates a write request associated with the first illustrated request pulse in the BUS_WR curve 204 in order to write data designated as "ABC". In response to this write request pulse, the synchronizer circuit 120 propagates a signal through the flip-flops 121 and 122, and generates the RESET signal at the output 157 to clear the flip-flops 151 and 152 of the slow clock domain synchronizer circuit 150. This causes the flip-flop output signals S1 and S2 to go low as shown in curves 210 and 212 in FIG. 2. The pulse generator circuit flip-flop 153 also provides a low output signal S3 (curve 214) in response to the BUS_WR pulse signal associated with the data "ABC". The START signal propagates through the flip-flops 151, 152 and 153 synchronized to the second clock signal SLOW_CLK, and the pulse generator circuit 155 provides a write enable signal WR_EN (curve 216) to the multiplexer 144 with a rising edge corresponding to the rising edge of the S2 signal (curve 212), and a falling edge corresponding to the rising edge of the S3 signal (curve 214). This transfers the data "ABC" as the register data input signal REG_DATA at the input of the second register 140 to complete the write operation from the fast clock domain circuit 102 to the slow clock domain circuit 130. In this example, the write operation has a duration 221 shown in FIG. 2, which is less than two cycles of the second clock signal SLOW_CLK.

The host circuit thereafter initiates a further bus write request to write the data "DEF". This request is still pending when the host circuit thereafter attempts to write data designated as "GHI". In the illustrated example, therefore, the host circuit attempts "back-to-back" write operations causing two corresponding pulses indicated at 220 in the bus write request signal waveform 204, in which the second bus write request signal pulse occurs before completion of the earlier write request. The write request pulse signal BUS_WR causes the RESET signal to go low to clear the flip-flops 151 and 152 of the synchronizer circuit 150, shown as downward edges in the curves 210 and 212. The fast clock domain synchronizer circuit 120 propagates the BUS_WR signal through the flip-flops 121 and 122 to cause the AND gate 126 to generate a pulse signal CLEAR at the output 127. The CLEAR pulse at the output 127 is asserted for a single cycle of the first clock signal FAST_CLK in the illustrated example, and creates an inverted pulse signal RESET at the output 157 of the AND gate 156. In addition, the output signal S3 of the third flip-flop 153 goes low in response to the write request pulse signal BUS_WR, shown in curve 214.

Unlike other multiple clock domain synchronization circuitry, the illustrated interface circuit 100 of FIG. 1 advantageously clears the pending write operation associated with the data "DEF" in response to the second bus write request pulse of the back-to-back write at 220. The interface circuitry 100 advantageously allows the host circuit to implement back-to-back write requests without waiting for an acknowledgment of completion of a prior pending request. This avoids the host and peripheral circuit software/logic overhead associated with implementing a request/acknowledgment protocol between the circuits 102 and 130. In addition, the cancellation of a prior pending write request implemented by the interface circuitry 100 reduces data latency in the system. This is accomplished in the illustrated implementation by the RESET signal clearing the flip-flops 151 and 152 of the slow clock domain synchronizer circuit 150 prior to assertion of the WR_EN signal that controls the slow clock domain write control circuit multiplexer 144. As seen in this example, the second BUS_WR pulse at 220 initiates a further resetting of the output signal S1 from the flip-flop 151, which goes low in response. The flip-flops 151, 152 and 153 propagate the START signal state with successive cycles of the second clock signal SLOW_CLK, and the pulse generator circuit 155 generates the WR_EN signal pulse in curve 216. The WR_EN pulse transitions to the high second state at the rising edge of the S2 signal (curve 212), and transitions to the low first state at the rising edge of the S3 signal (curve 214). In this manner, the pulse width of the WR_EN signal is approximately one half clock cycle of the second clock signal SLOW_CLK. The interface circuitry 100 thus synchronizes the transfer of the updated write data "GHI" after terminating the previously initiated write operation associated with the data "DEF". The completed write operation associated with the data "GHI" has a duration 222 which is less than two cycles of the second clock signal SLOW_CLK.

As seen in the example of FIG. 2, each bus write request from the fast clock domain host circuit clears any pending request in the slow clock domain and propagates itself. As a result, the interface circuitry 100 can accommodate back-to-back requests within a slow clock cycle, and the final request is propagated reliably. This ensures that a valid write reaches the destination within a fixed maximum of two cycles of slow clock domain. Moreover, the write operation synchronizes the data transfer to the slow clock domain register 140, and the system does not require complex host or peripheral circuit software or logic. Furthermore, data latency issues can be minimized, even where the first and second clock speeds are significantly different. It is noted in the example of FIG. 2 that the propagation of the signal through the slow clock domain synchronizer circuitry 150 and 155 is the predominant data latency driver, and the illustrated examples provide for robust write operations within two slow clock cycles. As previously noted, other solutions use request-acknowledge based synchronization, in which another write request cannot be initiated until the request-acknowledge loop is completed. Presently disclosed example interface circuits 100, in contrast, do not require the software and/or logic complexity associated with implementing an acknowledgment-based system, and advantageously allow a host system to perform back-to-back write operations. This is beneficial, for example, where a host CPU is frequently updating a control register of a peripheral slow clock domain circuit 130 (e.g., a processor providing a counter value to a PWM control peripheral circuit) in a closed loop control application. The disclosed interface circuitry 100 advantageously allows the host circuit to quickly provide the latest control value to the peripheral circuit register 140 regardless of whether a previously submitted write operation is currently pending in the synchronization circuitry. Thus, the disclosed examples facilitate closed-loop control situations and other applications in which quick data writes to a peripheral slow clock domain register 140 are desired.

Figure 3:
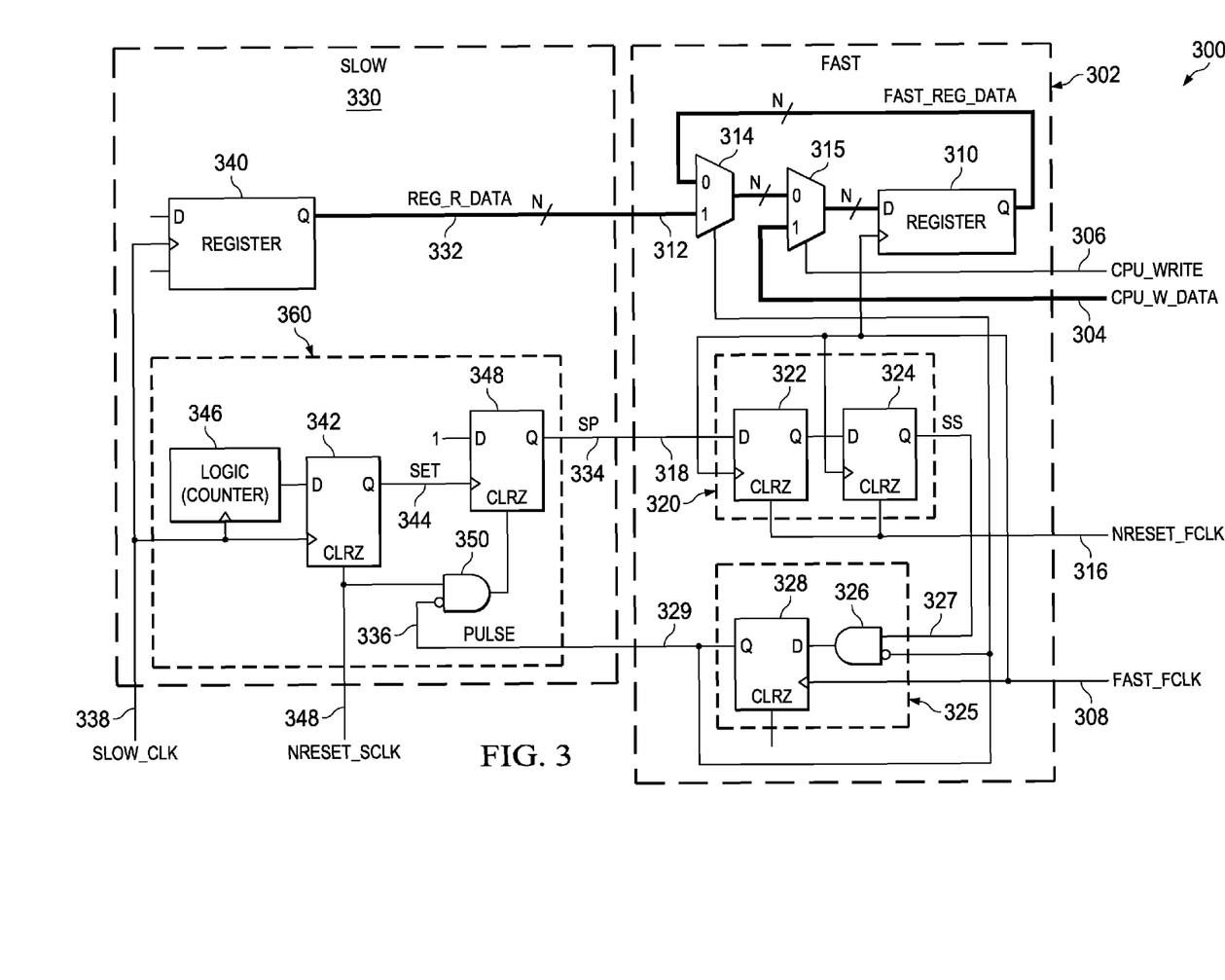
FIG. 3 is a schematic diagram of an interface circuit to synchronize data for reading from a low speed clock domain register to a high speed clock domain register according to an embodiment.
Figure 4:
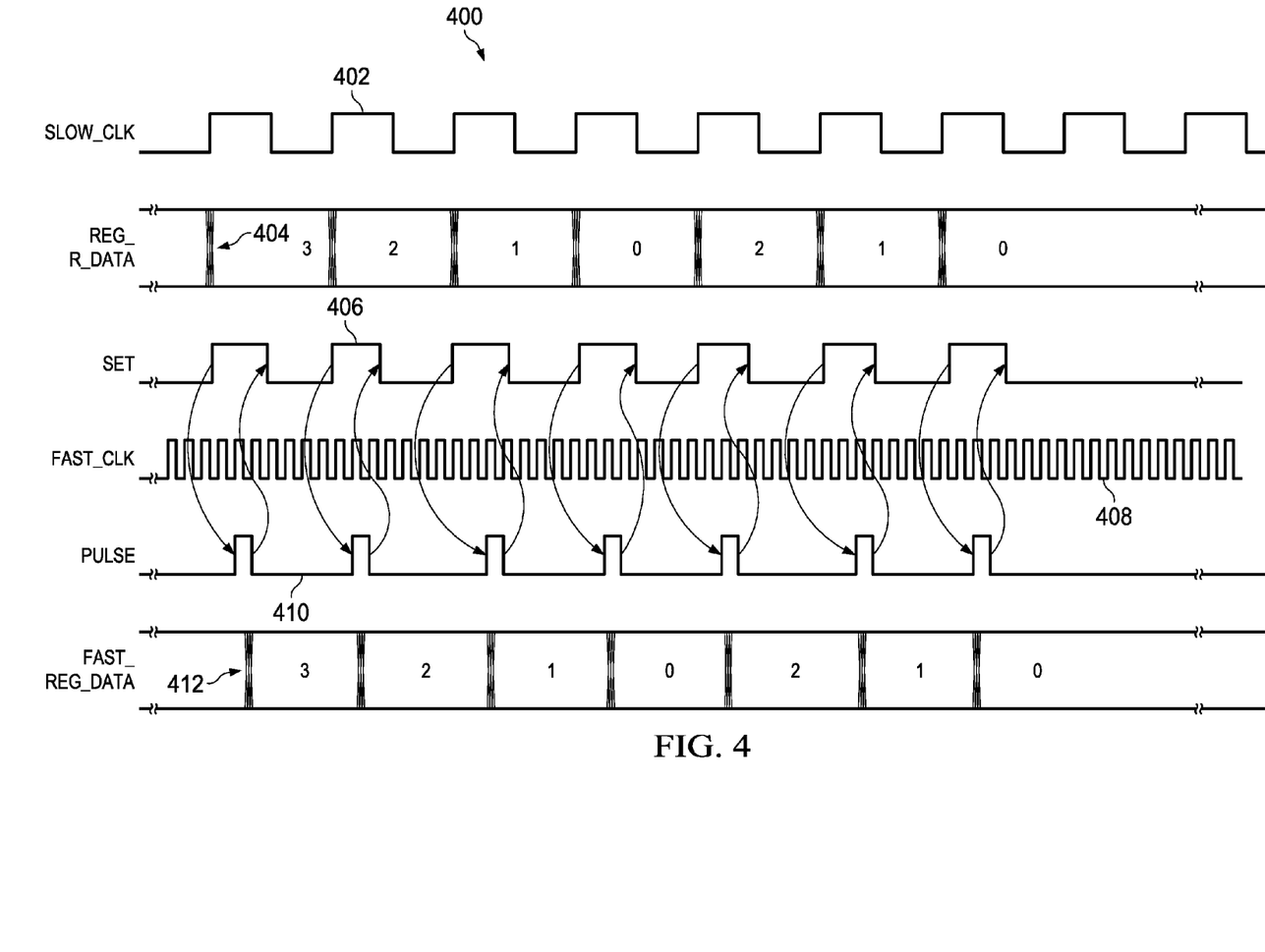
FIG. 4 is a signal diagram showing signal waveforms in the circuit of FIG. 3.

Referring also to FIGS. 3 and 4, FIG. 3 shows another example multiple clock domain system including a first circuit 302 with a first N-bit register 310 operated according to a first clock signal FAST_CLK. A second circuit 330 is operated according to a second clock signal SLOW_CLK that is slower than the first clock signal FAST_CLK, and the second circuit 330 includes a second register 340. The first register 310 receives the FAST_CLK signal from a node 308 of the first circuit 302, and includes an N-bit data input (D) and an N-bit data output (Q). The circuit 302 also includes first and second N-bit multiplexers 314 and 315. A first N-bit input of the multiplexer 314 is connected to the N-bit output (Q) of the fast clock domain register 310 to refresh the register data signal FAST REG_DATA according to the first clock signal FAST_CLK when the control inputs of the multiplexers 314 and 315 are in a first state (low). A second N-bit input 312 of the first multiplexer 314 is connected to an N-bit output 332 of the slow clock domain register 340 to receive an N-bit register read data signal REG_R_DATA. When the control input of the multiplexer 314 is in a second state (high), the REG_R_DATA signal is passed to the N-bit input of the second multiplexer 315. The N-bit output of the second multiplexer 315 is connected to the N-bit input of the register 310. The output data from the first multiplexer 314 is passed to the N-bit data input (D) of the register 310 when the multiplexer control input 306 receives a CPU write control input signal CPU_WRITE in a first state (low) from a host circuit (not shown in FIG. 3). When the CPU_WRITE signal is in a second state (high), the multiplexer 315 passes an N-bit CPU_W_DATA signal from the host circuit to the register data input via a second N-bit multiplexer or other read control circuit 314. The read control circuit 314 selectively couples the output 332 of the second register 340 with the input of the first register 310 to read data from the second register 340 to the first register 310 in response to the read enable pulse signal PULSE being in the second state (high).

The slow clock domain register 340 includes a clock input connected to a node 338 of the second circuit 330 to receive the clock signal SLOW_CLK. The register 340 can be written by any suitable peripheral circuitry (not shown) to store the data REG_R_DATA and can include suitable circuitry for refreshing the data (not shown) according to the slow domain clock signal SLOW_CLK.

An interface circuit 300 synchronizes data transfer for a read operation to read N-bit data from the slow clock domain register 340 to the fast clock domain register 310. The interface circuit 300 includes a read synchronizer circuit 320 and a read pulse generator circuit 325 operated according to (e.g., clocked by) the first clock signal FAST_CLK, as well as a trigger circuit 360 operated according to the second clock signal SLOW_CLK. The first circuit 302 includes an active low reset input 316 to receive a fast clock domain reset signal NRESET_FCLK from a host circuit (not shown) to reset the read synchronizer circuit 320. The second circuit 330 includes an active low reset input 348 to receive a slow clock domain reset signal NRESET_SCLK from a peripheral circuit (not shown) to selectively reset the trigger circuit 360. The read pulse generator circuit 325 provides a read enable pulse signal PULSE synchronized to the first clock signal FAST_CLK in one of a first state low and a second state high. In operation of the illustrated example, the circuit 325 includes an input 327 to receive a synchronized start pulse signal SS from an output of the read synchronizer circuit 320. The read pulse generator circuit 325 also includes an output 329 to provide the read enable pulse signal PULSE synchronized to the first clock signal FAST_CLK. The read pulse generator circuit 325 in this example provides a high PULSE signal in response to a low to high transition (rising edge) of the synchronized start pulse signal SS, and thereafter provides a low PULSE signal.

The trigger circuit 360 of the slow clock domain circuit 330 provides a set pulse signal SP to cause the read pulse generator 325 to provide a new read enable pulse signal PULSE every integer number L cycles of the second clock signal SLOW_CLK. In this manner, the read data is continually updated, allowing a host circuit associated with the high clock speed domain to initiate a read operation as needed. This provides a number of advantages over other solutions for reading from a slow clock domain register to a faster clock domain register. For instance, other approaches utilize multiple reads, with a host circuit comparing the read data and determining which data is likely to be correct (e.g., based on consistent results from at least two out of three reads). This approach requires extra software or logic in the host circuit, and introduces data latency. In another alternate approach, the slow clock domain circuit provides a read event control signal, which is synchronized in the fast clock domain, and the fast clock domain host circuit waits to read the data until the control signal asserted. This approach also introduces data latency, and requires additional software and/or hardware logic in the fast clock domain circuitry. The interface circuitry 300 in the example of FIG. 3, in contrast, allows the fast clock domain circuit to read data from the slow clock domain circuit register 340 at any time, without any handshaking or additional processing overhead or latency. In addition, the interface circuit 300 synchronizes the data to the target clock signal FAST_CLK to provide correct read data without any restrictions, and free from metastability issues. In this regard, the circuitry 300 provides fully synchronous logic without any special host processor software implementation.

The trigger circuit 360 operates according to the second clock signal SLOW_CLK, and includes a logic circuit 346 and a flip-flop 342 having inputs connected to the circuit note 338 to receive the second clock signal SLOW_CLK. The logic circuit 346 in one example is a counter that includes a configurable value. In each cycle of the second clock signal SLOW_CLK, and output of the logic circuit 346 provides a signal having a first state (e.g., low) until a counter value reaches zero. Once the counter reaches zero, the logic circuit 346 outputs a signal having a second state (e.g., high). The output signal from the logic circuit 346 is provided to a data input of the flip-flop 342. The flip-flop 342 includes a clock input connected to the node 338 to receive the SLOW_CLK signal, as well as a data output (Q) that provides a set signal AT to a clock input of a further flip-flop 348. A data input of the flip-flop 348 is connected to a constant signal having a high value (e.g., "1"), and the data output (Q) of the flip-flop 348 provides the set pulse signal SP to an output node 334.

The flip-flop 348 provides the SP signal as a data input to the read synchronizer circuit 320. The synchronizer circuit 320 propagates the signal and generates the synchronized start pulse signal SS to cause the read pulse generator 325 to provide a new read enable pulse signal PULSE. The flip-flop 348 of the trigger circuit 360 also includes a clear input (CLRZ) connected to an output of an AND gate 350. The AND gate 350 includes a first input connected to the reset signal node 348 to receive the NRESET_SCLK signal, and a second inverting input 336 that receives the PULSE signal from the read pulse generator circuit 325. The AND gate 350 provides a clear signal to reset the data output of the flip-flop 348 to a first state (e.g., low). By this operation, the logic circuit 346 provides a high output signal every integer number L cycles of the second clock signal SLOW_CLK. Each of these signals initiates a new PULSE signal to cause the read control circuit multiplexer 314 to update the fast clock domain register 310 with the register data REG_R_DATA from the output of the slow clock domain register 340. Thus, the register is current whenever the host circuit needs to read it. In addition, the read pulse generator circuit 325 resets the trigger circuit 360 in response to the PULSE signal in order to provide continuous updating. In this manner, a host CPU can easily read the contents of the register 310 without any handshaking or excess software overhead, and without significant data latency issues. In certain examples, the value of the counter in the logic circuit 346 can be configured by the host circuit, thus allowing programming of the value of the integer number L to any integer number greater than 1.

The example read synchronizer circuit 320 in the fast clock domain circuit 302 of FIG. 3 includes an input 318 to receive the set pulse signal SP, and an output that provides the synchronized start pulse signal SS to the input 327 of the read pulse generator circuit 325. The read synchronizer circuit 320 provides a low synchronized start pulse signal SS a non-zero integer number J edges of the first clock signal FAST_CLK after the set pulse signal SP transitions low. The read synchronizer circuit 320 also provides a high SS signal an integer number J edges of the first clock signal FAST_CLK after the set pulse signal SP transitions high. In the illustrated example, the synchronizer circuit 320 includes a first flip-flop 322 with a data input that receives the set pulse signal SP and a data output connected to a data input of a second flip-flop 324. In the illustrated example, the circuit 320 includes two flip-flops 322 and 324, and J=2. Other implementations are possible using a different number of flip-flops, with J corresponding to the number of flip-flops in the read synchronizer circuit 320. The first and second flip-flops 322 and 324 in the illustrated example include clock inputs connected to the node 308 to receive the first clock signal FAST_CLK, as well as clear inputs connected to the node 316 to receive the NRESET_FCLK signal from a host circuit. The second flip-flop 324 includes a data output (Q) connected to the node 327 to provide the synchronized start pulse signal SS to the read pulse generator circuit 325.

The read pulse generator circuit 325 includes an AND gate 326 with a first input connected to the node 327 to receive the SS signal, as well as a second inverting input connected to the node 329 to receive the PULSE signal. A flip-flop 328 of the read pulse generator circuit includes a data input (D) connected to the output of the AND gate 326, and a data output (Q) connected to the output node 329 to provide the PULSE signal. In this example, the circuit 325 provides a high signal PULSE having a pulse width of one cycle of the first clock signal FAST_CLK. Other implementations are possible in which the pulse width can be increased by including further flip-flops in the read pulse generator circuit 325 or by using a pulse extender circuit (not shown).

FIG. 4 illustrates a signal diagram 400 showing signal waveforms in the interface circuit 300 of FIG. 3. The diagram 400 includes a curve 402 showing an example second clock signal SLOW_CLK, a curve 404 representing the N-bit register read data signal REG_R_DATA at the output Q of the slow clock domain register 340, a curve 406 illustrating the set signal SET, a curve 408 illustrating an example first clock signal FAST_CLK, a curve 410 illustrating the PULSE signal and a curve 412 representing the N-bit data FAST REG_DATA of the fast clock domain register 310. The REG_R_DATA is transferred to the fast clock domain register 310 according to the repeated PULSE signals shown in curve 410, and the read data is synchronized to the first clock signal FAST_CLK. FIG. 4 shows an example case in which the transferred N-bit data signal REG_R_DATA successively represents values "3, 2, 1, 0, 2, 1 and 0" in a sequence. In this example, moreover, the read latency is short, since the PULSE signal is triggered within two cycles of the first clock signal FAST_CLK, and the target register 310 receives the REG_R_DATA within a further fast clock cycle, for a total latency of approximately three cycles of the first clock signal FAST_CLK.

Figure 5:
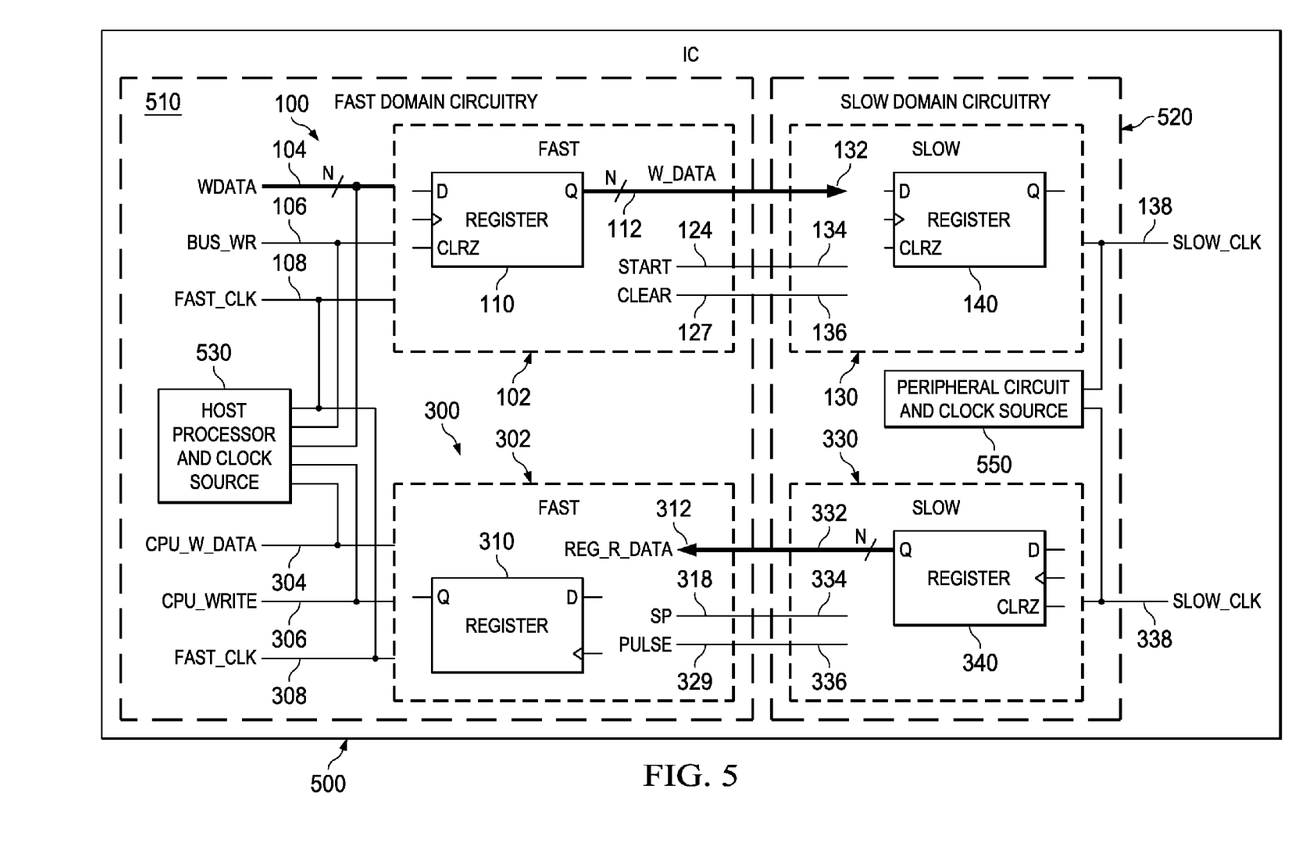
FIG. 5 is a schematic diagram of an integrated circuit with high and low speed clock domains and associated registers, including interface circuitry to synchronize data transfers between the high and low speed clock domain registers according to an embodiment.
Figure 6:
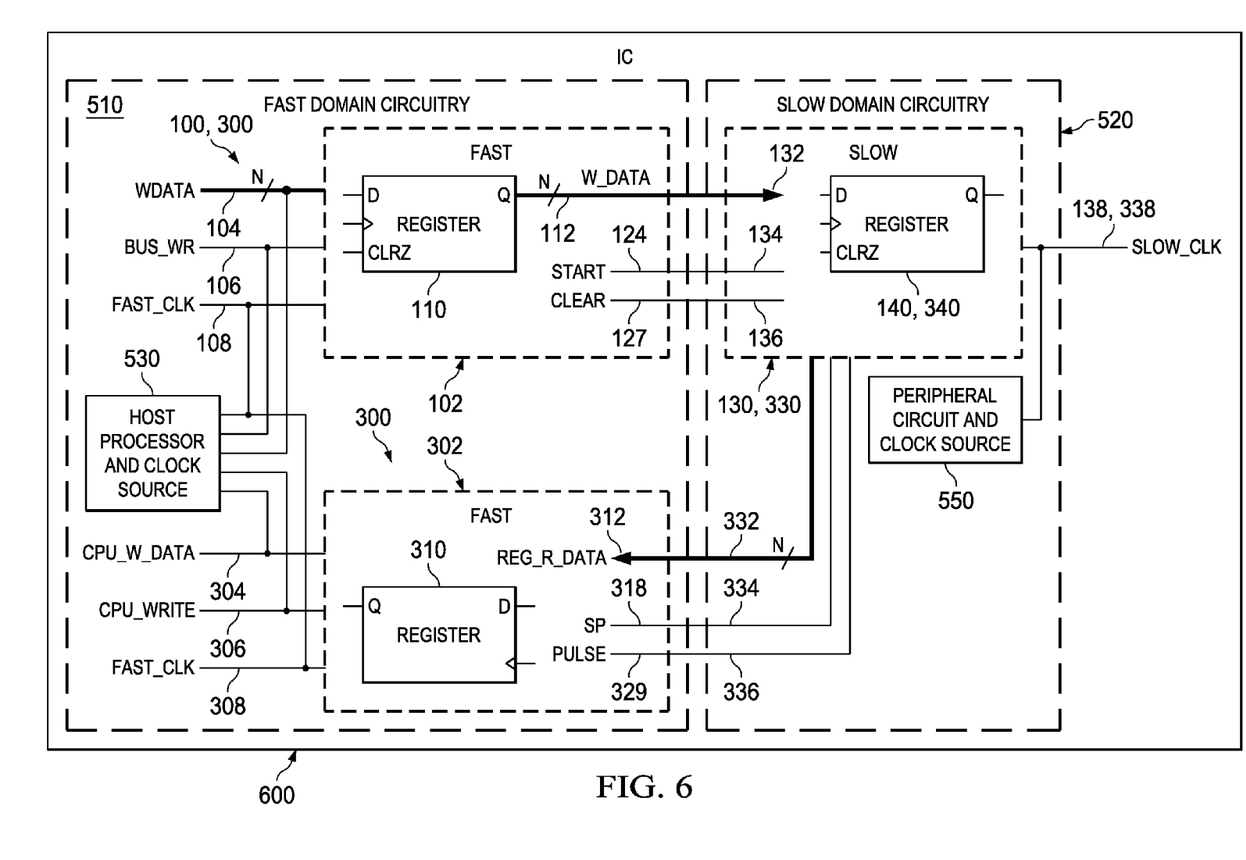
FIG. 6 is a schematic diagram of an integrated circuit with high and low speed clock domains and associated registers, including interface circuitry to synchronize data transfers between the high and low speed clock domain registers according to another embodiment.

Referring now to FIGS. 5 and 6, the write and read interface circuits 100 and 300 can be concurrently used to interface a fast clock domain circuit 102, 302 with a slow clock domain circuit 130, 330 to facilitate both write and read operations therebetween. These concepts can be combined for use in association with dedicated registers or in situations in which a single register in either or both of the fast and slow clock domain circuits is both written to and read from, or combinations thereof. In addition, the fast and slow clock domain circuits can be on separate integrated circuit devices, or these can be part of a single integrated circuit as illustrated in the examples of FIGS. 5-7.

FIG. 5 shows an integrated circuit (IC) 500 including fast domain circuitry 510 and slow domain (peripheral) circuitry 520. The IC 500 in this example includes high speed or fast clock domain circuits 102 and 302, as well as low speed (slow) clock domain circuits 130 and 330 as previously described. The fast domain circuitry 510 in the IC 500 of FIG. 5 uses separate fast domain registers 110 and 310 for respectively writing data to and receiving read data from separate registers 140 and 340 of the slow domain circuit 520. FIG. 6 illustrates another integrated circuit example 600 including fast domain circuitry 510 and peripheral (slow domain) circuitry 520, in which a single slow clock domain register 140, 340 is used for both read and write operations. In these examples, the fast domain circuitry 510 includes a host processor circuit 530 that includes a clock source to provide the first clock signal FAST_CLK. The slow domain circuit 520 in these examples includes a peripheral circuit 550 with a clock source that provides the second clock signal SLOW_CLK. The circuits 510 and 520 in this example are fabricated in a single IC 500, 600 and the IC 500, 600 includes interface circuitry 100, 300 as previously described above in connection with FIGS. 1 and 3, respectively.

Figure 7:
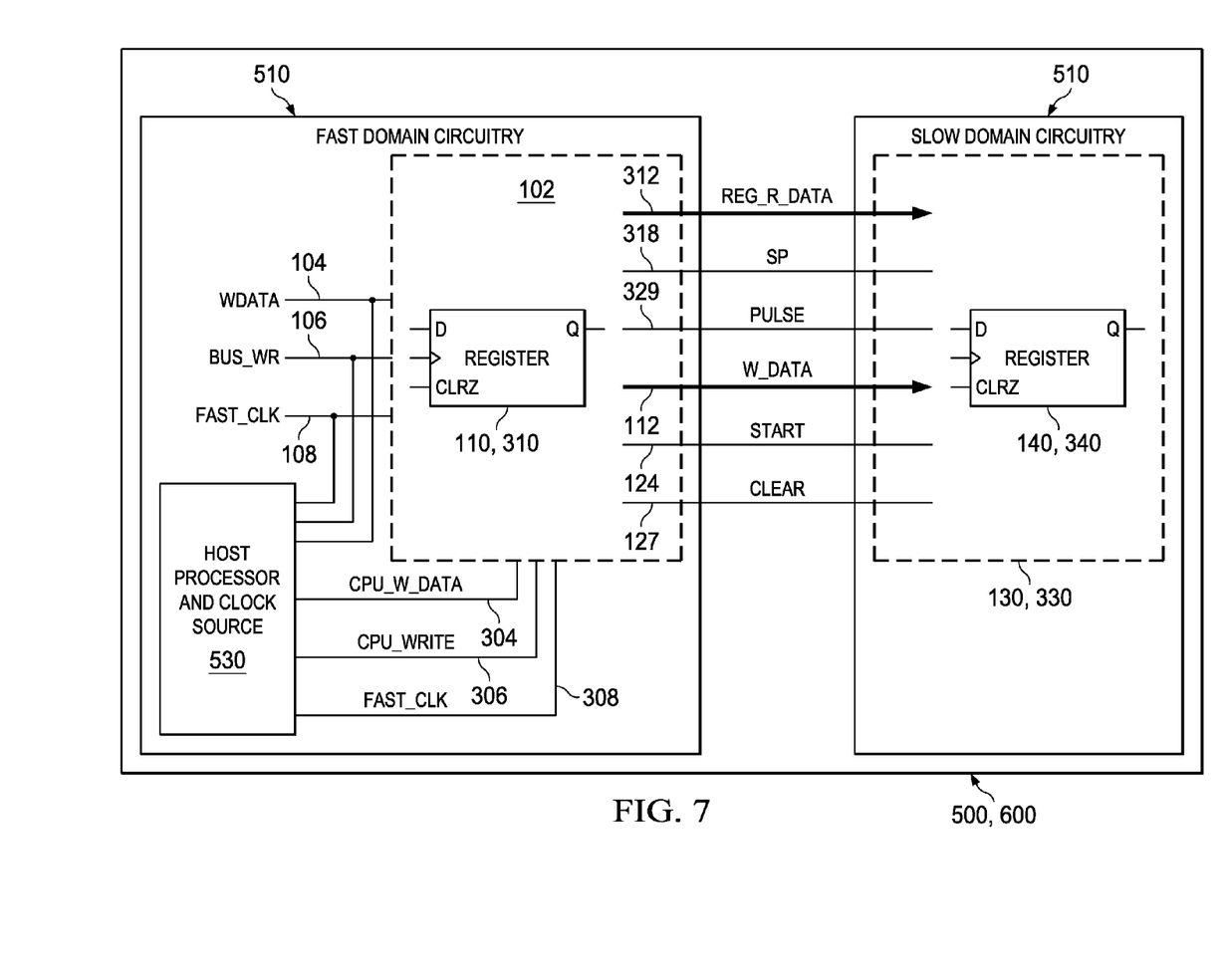
FIG. 7 is a schematic diagram of another integrated circuit with high and low speed clock domains and associated registers, including interface circuitry to synchronize data transfers between the high and low speed clock domain registers according to another embodiment.

FIG. 7 shows another IC example including high and low speed clock domains and associated registers, along with interface circuitry to synchronize data transfers between the high and low speed clock domain registers according. In the examples of FIGS. 5-7, the combination of the write interface circuit 100 and the read interface circuit 300 provides the above-described benefits in combination for both read and write operations. Moreover, the combination of these benefits also provides additional capabilities to a host processor or CPU 530 in the fast clock domain. For example, if the host processor 530 initiates a read operation from a single low speed clock domain register to a single high speed clock domain register as shown in FIG. 7 right after writing the slow clock domain register 140, the interface circuitry 100, 300 updates the fast clock domain register 110, 310 and then the write synchronization process will begin as described above. This mechanism facilitates "write and immediate read" operations initiated by software and/or firmware executed by the host processor circuit 530.

Disclosed example interface circuits 100, 300 can be used as a general data synchronizer between any fast and slow clock domains, whether fabricated on a single integrated circuit 500, 600, or in systems in which the first and second clock domain circuits are implemented on separate ICs. The disclosed examples provide fully synchronous logic for data transfer between the two clock domain circuits, without requiring any special software or added logic. In addition, the disclosed examples allow back-to-back write operation, and certain embodiments require only to slow clock domain cycles for write operations, whereas other solutions require six cycles to implement handshaking request/acknowledgment protocols. Thus, the software overhead burden is eliminated and data latency is reduced by the disclosed examples. Moreover, the disclosed solutions provide power efficiency in the transfer of data between fast and slow clock domain circuits, for instance, where the data write operations from the fast clock domain register 110 to the slow clock domain register 140 used just to slow clock cycles. In addition, as described above in connection with FIG. 3, the read operation to transfer data from a peripheral registered 342 a fast clock domain register 310 can be performed without any restrictions. The disclosed examples allow faster and robust data transfer operations, which is particularly beneficial for peripheral circuits that operate at a much lower clock speed than the host processor.

Further aspects of the present disclosure include methods for transferring data between registers of fast and slow clock domains. The methods can be implemented using any suitable hardware, including without limitation the above-described example interface circuits 100 and/or 300. For write operations from a register of the fast clock domain to a register of the slow clock domain, an example method includes provision or generation of a reset signal (e.g., RESET signal described above) in response to a write request signal (e.g. BUS_WR). The write operation method further includes clearing or resetting a synchronizer circuit (e.g., resetting the synchronizer circuit 150 above) in response to the reset signal, providing a synchronized start signal (e.g., signal S2 above) synchronize to the slow clock domain clock signal (e.g., SLOW_CLK), and generating a write enable pulse signal (e.g., WR_EN) to connect an output (e.g., 112) of the fast clock domain register (e.g., 110) to a data input (e.g., 141) of the slow clock domain register. As described above, this technique clears or resets the synchronizer circuitry in response to a write request signal, and can be advantageously employed to facilitate back-to-back write operations without handshaking or other request/acknowledgment software/firmware overhead.

In another aspect, methods for reading from a slow clock domain register to a fast clock domain register are provided, which can be implemented alone or in combination with the write operation methods. The read method in one example includes generating or providing a set pulse signal (e.g., SP described above) every integer number L cycles of a slow clock domain clock signal (e.g., SLOW_CLK), wherein L is greater than 1, providing a read enable pulse signal (e.g., PULSE above) every integer number L slow clock cycles in response to the set pulse signal, and selectively coupling an output of the slow clock domain register (e.g., register 340 above) with an input of the fast clock domain register (e.g., 310 above) to read data from the slow crock register to the fast clock register in response to the read enable pulse signal (e.g., PULSE).

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An interface circuit to synchronize data transfer between a first register of a first circuit operated according to a first clock signal, and a second register of a second circuit operated according to a second clock signal slower than the first clock signal, comprising:
    a synchronizer circuit, including an input to receive a reset signal, and an output to provide a synchronized start signal, the synchronizer circuit configured to provide the synchronized start signal in a first state in response to the input receiving the reset signal in a first state, and to provide the synchronized start signal in a different second state a non-zero integer number K edges of the second clock signal after the reset signal transitions to a second state;
    a pulse generator circuit, including an input to receive the synchronized start signal, and an output configured to provide a write enable pulse signal in response to the synchronized start signal transitioning from the first state to the second state;
    a write control circuit configured to selectively connect an output of the first register to an input of the second register to write data from the first register to the second register in response to the write enable pulse signal; and
    a dual flip-flop circuit, including an input to receive a write request signal, and an output coupled with the input of the synchronizer circuit, the dual flip-flop circuit configured to provide the reset signal as a pulse signal in the second state for a non-zero time synchronized to the first clock signal in response to the input receiving the write request signal in a predetermined state to clear any prior pending write request and begin a new write from the first register to the second register.

2. The interface circuit of claim 1, wherein K=3.

3. The interface circuit of claim 1, wherein the synchronizer circuit includes:
    a first flip-flop, including a clock input connected to receive the second clock signal, a data input coupled to receive a signal having a first state, a clear input connected to the output of the dual flip-flop circuit to receive the reset signal, and a data output; and
    a second flip-flop, including an inverting clock input coupled to receive the second clock signal, a data input connected to the data output of the first flip-flop, a clear input connected to the output of the dual flip-flop circuit to receive the reset signal, and a data output to provide the synchronized start signal.

4. The interface circuit of claim 3, wherein the pulse generator circuit, includes:
    a third flip-flop, including a clock input connected to receive the second clock signal, a data input connected to the data output of the second flip-flop, and a data output; and
    an AND gate, including a first inverting input connected to the data output of the third flip-flop, a second input connected to the data output of the second flip-flop, and an output to provide the write enable pulse signal to an input of the write control circuit.

5. The interface circuit of claim 4, wherein K=3.

6. The interface circuit of claim 4, wherein the pulse generator circuit is configured to provide the write enable pulse signal having a pulse width of one half cycle of the second clock signal.

7. The interface circuit of claim 1, wherein the dual flip-flop circuit includes:
    a first flip-flop, including a clock input coupled to receive the first clock signal, a data input coupled to receive the write request signal, and a data output;
    a second flip-flop, including a clock input coupled to receive the first clock signal, a data input connected to the data output of the first flip-flop, and a data output;
    a first AND gate, including a first input connected to the data output of the first flip-flop, a second inverting input connected to the data output of the second flip-flop, and an output; and
    a second AND gate, including an inverting input connected to the output of the first AND gate, and an output connected to the input of the synchronizer circuit to provide the reset signal.

8. The interface circuit of claim 1, further comprising a read interface circuit to synchronize data reads from a third register of the second circuit operated according to the second clock signal to a fourth register of the first circuit operated according to the first clock signal, the read interface circuit including:
    a read pulse generator circuit configured to provide a read enable pulse signal synchronized to the first clock signal in one of a first state and a second state;

a read control circuit configured to selectively couple an output of the third register with an input of the fourth register to read data from the third register to the fourth register in response to the read enable pulse signal being in the second state; and a trigger circuit configured to provide a set pulse signal to cause the read pulse generator circuit to provide a new read enable pulse signal every integer number L cycles of the second clock signal.

9. The interface circuit of claim 8,
wherein the read pulse generator circuit includes an input to receive a synchronized start pulse signal, and an output to provide the read enable pulse signal synchronized to the first clock signal in one of the first state and the second state, the read pulse generator circuit configured to provide the read enable pulse signal in the second state in response to the synchronized start pulse signal transitioning from a first state to a second state and thereafter in the first state synchronized with the first clock signal; and wherein the read interface circuit further comprises a read synchronizer circuit, including an input to receive the set pulse signal, and an output connected to provide the synchronized start pulse signal to the input of the read pulse generator circuit, the read synchronizer circuit configured to provide the synchronized start pulse signal in the first state a non-zero integer number J edges of the first clock signal after the set pulse signal transitions to a first state, and to provide the synchronized start pulse signal in the second state the integer number J edges of the first clock signal after the set pulse signal transitions to a different second state.

10. The interface circuit of claim 9, wherein J=2.

11. The interface circuit of claim 9, wherein L is configurable.

12. The interface circuit of claim 8, wherein the trigger circuit includes:
a logic circuit operated according to the second clock signal and configured to provide an output signal in one of a first state and a second state, the logic circuit configured to provide the output signal in the second state every integer number L cycles of the second clock signal, and to provide the output signal in the first state otherwise, wherein L is greater than 1;

a first flip-flop, including a clock input coupled to receive the second clock signal, a data input coupled to receive the output signal from the logic circuit, and a data output to provide a set signal;

a second flip-flop, including a clock input connected to the data output of the first flip-flop, a data input connected to a predetermined voltage, a data output to provide the set pulse signal, and a clear input; and an AND gate, including a first inverting input coupled to receive the read enable pulse signal, and an output connected to the clear input of the second flip-flop.

13. The interface circuit of claim 12, wherein the logic circuit is configurable to set the value of L.

14. An interface circuit to synchronize data transfer between a first register of a first circuit operated according to a first clock signal, and a second register of a second circuit operated according to a second clock signal slower than the first clock signal, comprising:

a read pulse generator circuit configured to provide a read enable pulse signal synchronized to the first clock signal in one of a first state and a second state;

a read control circuit configured to selectively couple an output of the second register with an input of the first register to read data from the second register to the first register in response to the read enable pulse signal being in the second state; and a trigger circuit configured to provide a set pulse signal to cause the read pulse generator circuit to provide a new read enable pulse signal every integer number L cycles of the second clock signal, wherein L is greater than 1.

15. The interface circuit of claim 14,
wherein the read pulse generator circuit includes an input to receive a synchronized start pulse signal, and an output to provide the read enable pulse signal synchronized to the first clock signal in one of the first state and the second state, the read pulse generator circuit configured to provide the read enable pulse signal in the second state in response to the synchronized start pulse signal transitioning from a first state to a second state and thereafter in the first state synchronized with the first clock signal; and wherein the read interface circuit further comprises a read synchronizer circuit, including an input to receive the set pulse signal, and an output connected to provide the synchronized start pulse signal to the input of the read pulse generator circuit, the read synchronizer circuit configured to provide the synchronized start pulse signal in the first state a non-zero integer number J edges of the first clock signal after the set pulse signal transitions to a first state, and to provide the synchronized start pulse signal in the second state the integer number J edges of the first clock signal after the set pulse signal transitions to a different second state.

16. The interface circuit of claim 15, wherein J=2.

17. The interface circuit of claim 14, wherein the trigger circuit includes:
a logic circuit operated according to the second clock signal and configured to provide an output signal in one of a first state and a second state, the logic circuit configured to provide the output signal in the second state every integer number L cycles of the second clock signal, and to provide the output signal in the first state otherwise, wherein L is greater than 1;

a first flip-flop, including a clock input coupled to receive the second clock signal, a data input coupled to receive the output signal from the logic circuit, and a data output to provide a set signal;

a second flip-flop, including a clock input connected to the data output of the first flip-flop, a data input connected to a predetermined voltage, a data output to provide the set pulse signal, and a clear input; and an AND gate, including a first inverting input coupled to receive the read enable pulse signal, and an output connected to the clear input of the second flip-flop.

18. The interface circuit of claim 17, wherein the logic circuit is configurable to set the value of L.

19. An integrated circuit (IC), comprising:
a first circuit operated according to a first clock signal, the first circuit including a host processor, and a first register;

a second circuit operated according to a second clock signal slower than the first clock signal, the second circuit including a peripheral circuit, and a second register; and an interface circuit to synchronize data transfer between the first register and the second register, the interface circuit including:
a synchronizer circuit, including an input to receive a reset signal, and an output configured to provide a synchronized start signal, the synchronizer circuit configured to provide the synchronized start signal in a first state in response to the input receiving the reset signal in a first state, and to provide the synchronized start signal in a different second state a non-zero integer number K edges of the second clock signal after the reset signal transitions to a second state;

a pulse generator circuit, including an input to receive the synchronized start signal, and an output configured to provide a write enable pulse signal in response to the synchronized start signal transitioning from the first state to the second state;

a write control circuit configured to selectively connect an output of the first register to an input of the second register to write data from the first register to the second register in response to the write enable pulse signal; and a dual flip-flop circuit, including an input to receive a write request signal, and an output coupled with the input of the synchronizer circuit, the dual flip-flop circuit configured to provide the reset signal as a pulse signal in the second state for a non-zero time synchronized to the first clock signal in response to the input receiving the write request signal in a predetermined state to clear any prior pending write request and begin a new write from the first register to the second register.

20. The IC of claim 19, wherein the interface circuit further comprises:

a read pulse generator circuit configured to provide a read enable pulse signal synchronized to the first clock signal in one of a first state and a second state;

a read control circuit configured to selectively couple an output of the second register with an input of the first register to read data from the second register to the first register in response to the read enable pulse signal being in the second state; and a trigger circuit configured to provide a set pulse signal to cause the read pulse generator circuit to provide a new read enable pulse signal every integer number L cycles of the second clock signal.

* * * * *